US006736552B2

(12) United States Patent
Martwick

(10) Patent No.: US 6,736,552 B2
(45) Date of Patent: May 18, 2004

(54) OPTICALLY INTERCONNECTING INTEGRATED CIRCUIT CHIPS

(75) Inventor: Andrew W. Martwick, Folsom, CA (US)

(73) Assignee: Intel Corporation, Santa Clara, CA (US)

(*) Notice: Subject to any disclaimer, the term of this patent is extended or adjusted under 35 U.S.C. 154(b) by 280 days.

(21) Appl. No.: 09/898,517

(22) Filed: Jul. 3, 2001

(65) Prior Publication Data

US 2003/0007745 A1 Jan. 9, 2003

(51) Int. Cl.$^7$ ................................................ G02B 6/36
(52) U.S. Cl. ............................................ 385/88; 385/131
(58) Field of Search ............................... 385/88, 131, 132

(56) References Cited

U.S. PATENT DOCUMENTS

| | | | |
|---|---|---|---|
| 4,969,712 A | * 11/1990 | Westwood et al. | 385/14 |
| 5,123,078 A | * 6/1992 | Thomas | 385/130 |
| 5,125,054 A | * 6/1992 | Ackley et al. | 385/49 |
| 5,170,448 A | * 12/1992 | Ackley et al. | 385/31 |
| 5,195,154 A | * 3/1993 | Uchida | 385/88 |
| 5,287,422 A | * 2/1994 | Handa et al. | 385/14 |
| 6,158,901 A | * 12/2000 | Kovacic | 385/88 |
| 6,301,401 B1 | * 10/2001 | La | 385/14 |
| 6,389,202 B1 | * 5/2002 | Delpiano et al. | 385/49 |
| 6,477,286 B1 | * 11/2002 | Ouchi | 385/14 |
| 6,556,734 B1 | * 4/2003 | Bischel et al. | 385/14 |

OTHER PUBLICATIONS

Dally and Poulton, *Digital Systems Engineering*, Section 2.4—"Printed Circuit Boards," 1998, Cambridge University Press, Cambridge, United Kingdom, pp. 39–47.
Johnson and Graham, *High–Speed Digital Design—A Handbook of Black Magic*, Section 5.8.5—"Classic Layer Stacks," 1993, Prentice Hall PTR, Upper Saddle River, New Jersey, pp. 217–221.
Wadell, *Transmission Line Design Handbook*, Chapter 9 — "Printed Circuit Fabrication," 1991, Artech House, Inc. Norwood, MA, pp. 431–451.

* cited by examiner

Primary Examiner—Hae Moon Hyeon
(74) Attorney, Agent, or Firm—Fish & Richardson, P.C., P.A.

(57) ABSTRACT

An optical optical waveguide channel is formed in an intermediate layer of a printed circuit board (PCB) so that opto-electronic components on integrated circuit (IC) chips mounted on the PCB may be optically interconnected. At each end of the optical waveguide channel is an optical waveguide path perpendicularly extending from the end of the channel to a surface of the printed circuit board. An IC chip mounted on the PCB may include a die flip-mounted on a substrate. An optically transducing surface of the opto-electronic component is directed downward toward the substrate. Optical waveguide paths extend perpendicularly through the substrate, coupling with the optically transducing surfaces. The IC chips are mounted on the PCB, aligning the optical waveguide paths in the substrates with the optical waveguide paths in the PCB.

24 Claims, 4 Drawing Sheets

OPTICALLY INTERCONNECTING INTEGRATED CIRCUIT CHIPS

TECHNICAL FIELD

This invention relates to optically interconnecting opto-electric components on different integrated circuit (IC) chips, and also on the same IC chip, using a printed circuit board (PCB) on which the IC chip or chips are mounted.

BACKGROUND

Many electronics systems, including computer motherboards, include one or more IC chips mounted on PCBs. A PCB provides a surface on which the IC chips are mounted, and also provides electrical interconnections between the IC chips.

Signalling speed requirements between different IC chips in the same electronics system, and perhaps mounted on the same PCB, are ever increasing. In some cases, electrical signaling may not provide the needed, or desired, bandwidth, or may provide the bandwidth with costs. Some of the costs include a more complex design, in terms of multiplexing and demultiplexing the signals into multiple parallel lines. There may also be costs in terms of noise, both because the speed of the signaling may be nearing phyical limits and because of cross-talk between the parallel electrical interconnects.

Optical signaling, as compared to electrical signaling, offers significantly higher bandwidth and eliminates, or greatly reduces, the noise problems inherent with electrical signaling. An example where bandwidth requirements are making optical signaling between IC chips in the same system increasingly attractive, and in fact may require optical signaling, is in computer motherboards. For example, signaling between processor IC chips and memory IC chips on the same motherboard are already in some systems two gigabytes per second, and will certainly only increase in the future.

Optical signaling, however, poses design challenges not posed with electrical signaling. For example, optical signaling requires there to be an optical waveguide interconnection between the signal source and detector. In some cases, the optical interconnection between two IC chips within the same system has been provided with conventional optical fibers. However, this approach has its disadvantages. First, the optical fibers add cost to the system. Also, optical fiber connectors are typically large, and thus consume sometimes precious space, and the labor involved in providing connections to optical fibers is typically significant.

Better approaches to providing optical interconnects between IC chips within the same system, and even between opto-electronic components on the same IC chip, are therefore needed.

DESCRIPTION OF DRAWINGS

Like reference symbols in the various drawings indicate like elements.

DETAILED DESCRIPTION

Figure 1:
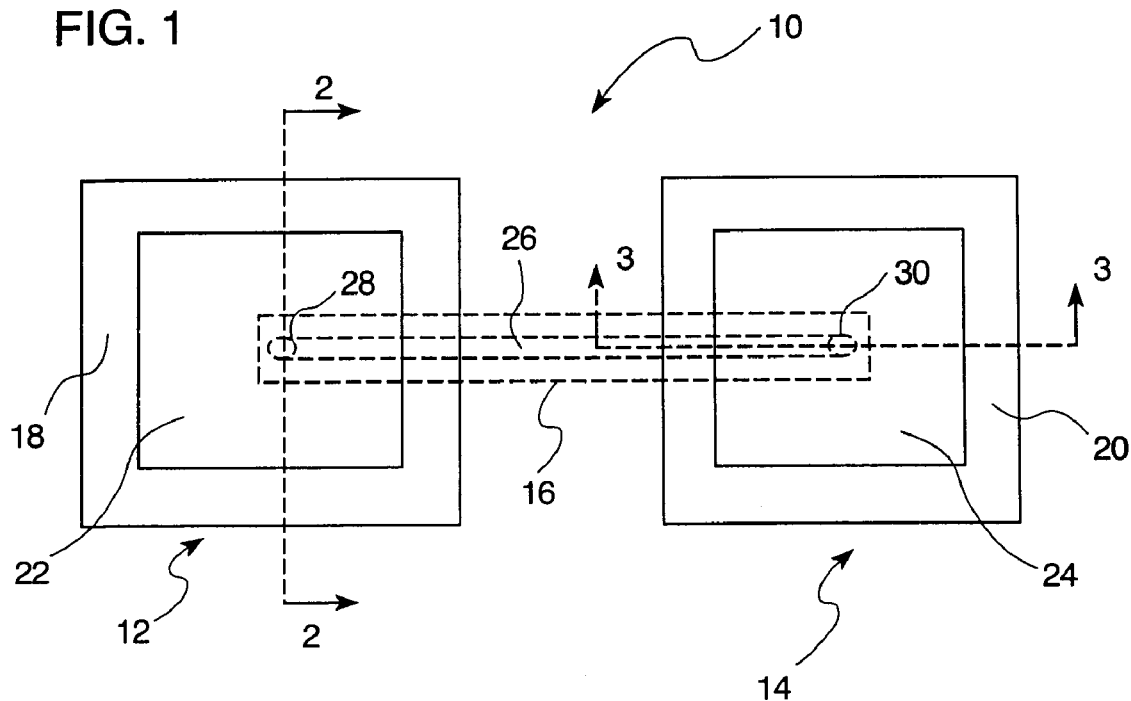
FIG. 1 is a pictorial drawing, from a top view, of an opto-electronic system in accordance with an embodiment of the invention.

Referring to FIG. 1, an opto-electronic system 10, in accordance with an aspect of the invention, includes a first integrated circuit (IC) chip 12 optically interconnected to a second IC chip 14 by way of a printed circuit board (PCB) 16. Each IC chip 12 and 14 includes a substrate 18 and 20 and a semiconductor die 22 and 24 mounted on the respective substrates 18 and 20. The IC chips 12 and 14 are mounted on the same PCB 16. The portions of the PCB 16 hidden under IC chips 12 and 14 are indicated by dashed lines.

An optical waveguide channel 26 extends planarly within the PCB 16 so as to optically connect opto-electronic components (not shown in FIG. 1) on the IC chip 12 and 14. One of the opto-electronic components may be a light-emitting device such as a light-emitting diode (LED), while the other opto-electronic component may be a photodetector to detect the light emitted by an LED. The opto-electronic components may be, as in this embodiment, surface-emitting or -detecting devices. In this case, the dies 22 and 24 are flip-mounted on their respective substrates 18 and 20, so that the surface-emitting or -detecting surfaces (collectively referred to in this specification as light-transducing surfaces) of the opto-electronic components are directed downward toward substrates 18 and 20.

The opto-electronic components, although not shown in FIG. 1, are positioned adjacent to optical waveguide paths 28 and 30. The waveguide paths 28 and 30 extend perpendicularly through the substrates 18 and 20 of the IC chips 12 and 14, and then extend further into the PCB 16, and adjoin the optical waveguide channel 26 in the PCB 16, at opposite ends of the channel 26. An embodiment of the waveguide paths 28 and 30 will be more fully understood from cross-sectional drawings in this specification that will be discussed later. In any event, the surface-emitting or -detecting regions of the opto-electronic components are thus optically coupled to the optical waveguide channel 26 in the PCB 16, and thus the opto-electronic components on the first and second IC chips 12 and 14 are optically interconnected.

Figure 2:
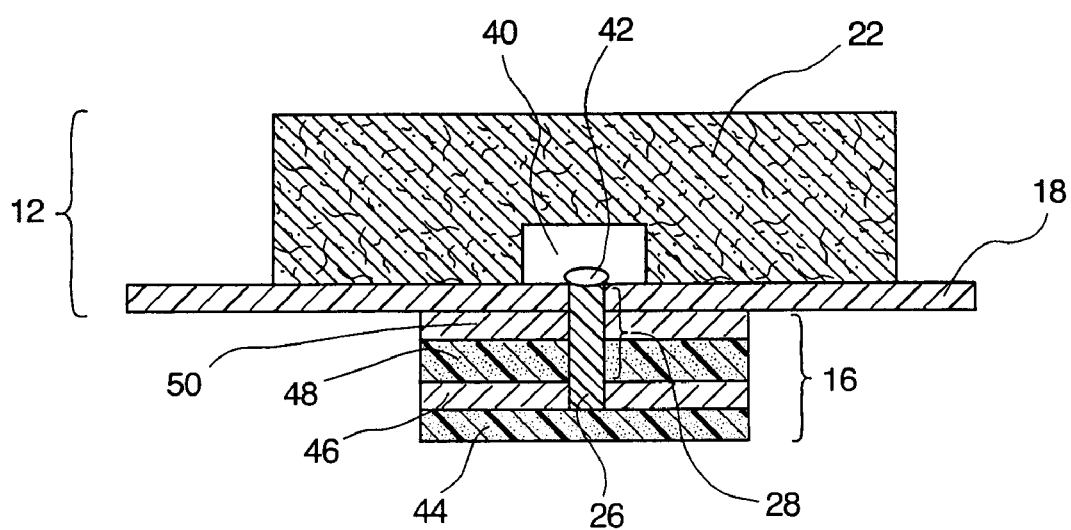
FIG. 2 is a cross-sectional drawing of the system shown in FIG. 1 at the cross-section indicated in FIG. 1.

In FIG. 2, a cross-section of the first IC chip 12 and the PCB 16, shows that the first IC chip 12 is on the PCB 16. Although FIG. 2 shows a cross-section of only the first IC chip 12, the second IC chip 14 may have a similar cross-section. Also shown in this cross-section is an opto-electronic component 40, as discussed but not shown previously, having a surface 42 that either emits light toward, or detects light from, the optical waveguide channel 26 in the PCB 16. The optical waveguide path 28 is shown extending from the surface 40 of the opto-electronic component 40, through the substrate 18 of the IC chip 12, and further through layers 50 and 48 of the PCB 16, to the optical waveguide channel 26. The optical waveguide path 28, as well as the optical waveguide channel 26, may be made of any number of optical waveguiding materials such as glasses and many types of epoxies and plastics. The manufacturing process required to attain this waveguiding structure within the substrate 18 and the PCB 16 will be explained later.

The layer structure of an example PCB 16 is also shown in the cross-sectional diagram of FIG. 2. Although various layer structures are intended to be within the scope of the invention, in this embodiment the PCB 16 includes a bottom fiber layer 44, a metal layer 46 on the fiber layer 44, another fiber layer 48 on the metal layer 46, and another metal layer 50 on the fiber layer 48. For clarity, the layer structure of the PCB 16 are not drawn to scale. Example widths of the layers 44, 46, 48 and 50 may be: 10 millimeters for the bottom fiber layer 44, 1.5 millimeters for the metal layer 46, 4.5 millimeters for the second fiber layer 48, and 1.5 millimeters for the second metal layer.

Figure 3:
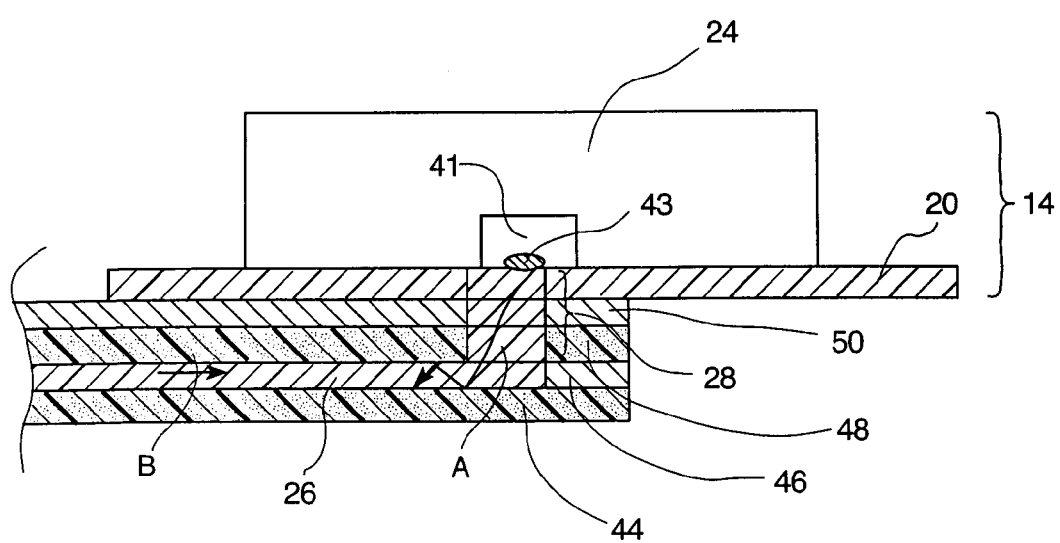
FIG. 3 is a cross-sectional drawing of the system shown in FIG. 1 at the cross-section indicated in FIG. 1.

FIG. 3 is another cross-section, although from a different perspective than the cross-section shown in FIG. 2. FIG. 3 is a cross-section of the second IC chip 14, although as with FIG. 2, the first IC chip 12 may have a similar cross-section. The second IC chip 14 has an opto-electronic component 41 having a light-emitting or -detecting surface 43, as with the first IC chip 12 shown in FIG. 2 and discussed previously.

Figure 4:
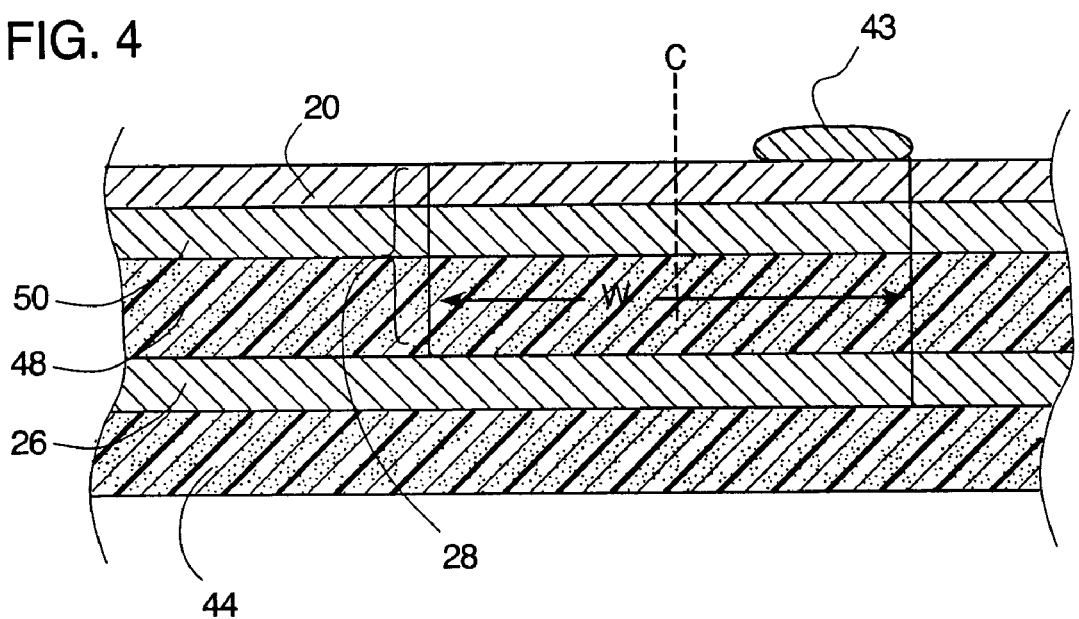
FIG. 4 is a portion of the FIG. 3 cross-sectional drawing, showing more detail the portion than in FIG. 3.

FIG. 4 focuses on a portion of the FIG. 3 cross-section, namely, the optical waveguide path 28 and the optical waveguide channel 26. FIGS. 3 and 4 show that the surface 43 of the opto-electronic component 41 may be offset from the center C (indicated in FIG. 4) of the optical waveguide path 28. In particular, the offset from center C is in a direction opposite from the junction between the optical waveguide path 28 and the optical waveguide channel 26. This offset serves to optically couple more light between the optical waveguide path 28 and the optical waveguide channel 26, compared to an embodiment where the surface 43 of the opto-electronic component is positioned at the center C of the optical waveguide path 28. Where the surface 43 of the opto-electronic component is offset (as in FIGS. 3 and 4), and where the opto-electronic component 41 is an optical transmitter, more of the light emitted by the surface 43 of the opto-electronic component 41 will enter the optical waveguide channel 26, as indicated by the arrow A in FIG. 3, as opposed to being reflected back toward surface 43. Conversely, where the opto-electronic component 41 is an optical receiver, more of the light traveling in the optical waveguide channel 26, as indicated by the arrow B in FIG. 3, will be received at the surface 43 of the optical receiver 41.

Optical coupling between the light-emitting or -detecting surface 43 in some configurations may be on the order of 50 percent, which may be sufficient in some applications. The degree of optical coupling may be altered, for example, by altering the width W (shown in FIG. 4) of the optical waveguide path 28.

Figure 5:
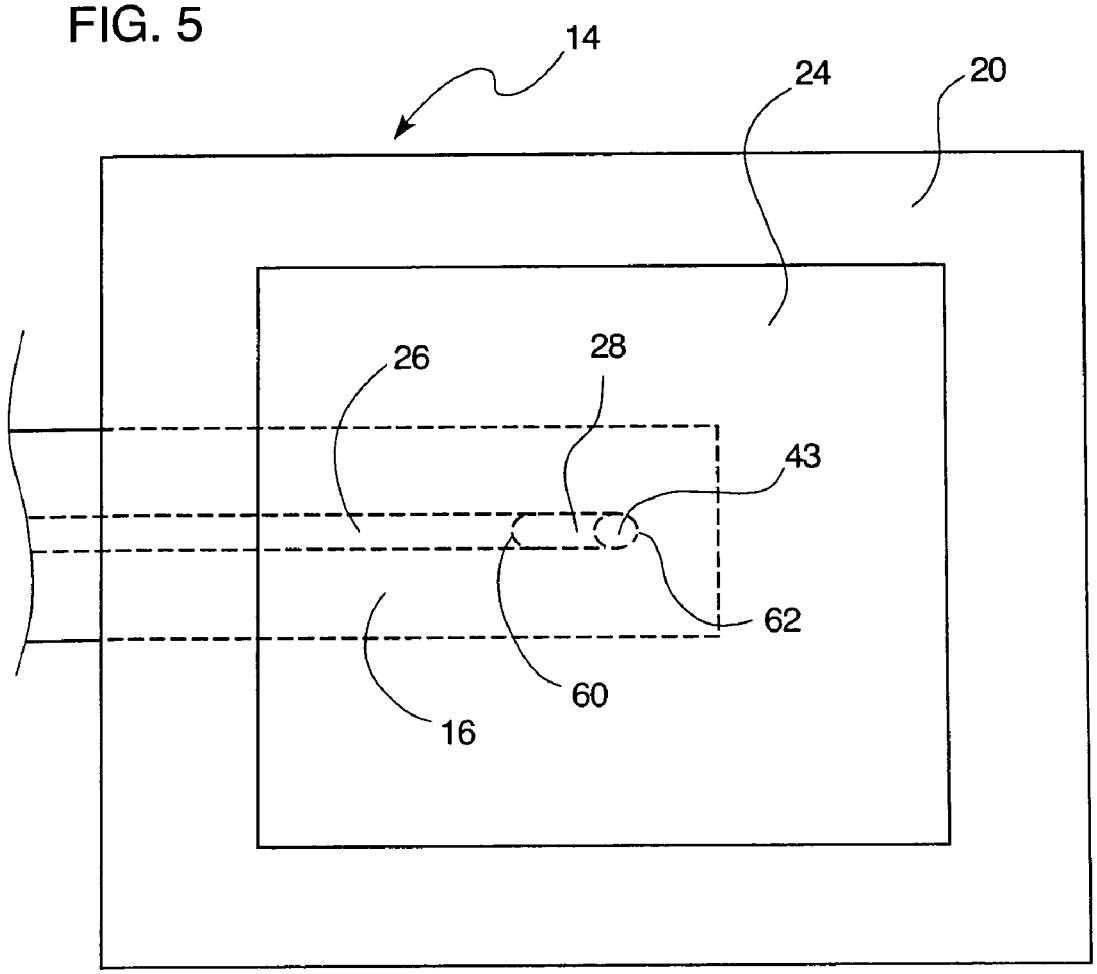
FIG. 5 is a pictorial drawing, from a top view, of part of the system shown in FIG. 1.

FIG. 5 is a top-view of the second IC chip 14, the dashed lines indicating structure hidden from view. FIG. 5 further illustrates the optical of the surface 43 of the opto-electronic component 41 (the entirety of the component 41 not shown in FIG. 5) being offset from the center C (see FIG. 4) of the optical waveguide path 28. In this embodiment, a cross-section of the optical waveguide path 28 is oblong shaped, and is also rounded at its sides 60 and 62. The sides 60 and 62 being rounded is a function of the manufacturing process that forms the openings in which optical waveguiding material is injected, which will be described in more detail later. Instead of having the rounded sides 60 and 62, the oblong cross-section may alternatively be rectangular or some other shape.

Figure 6:
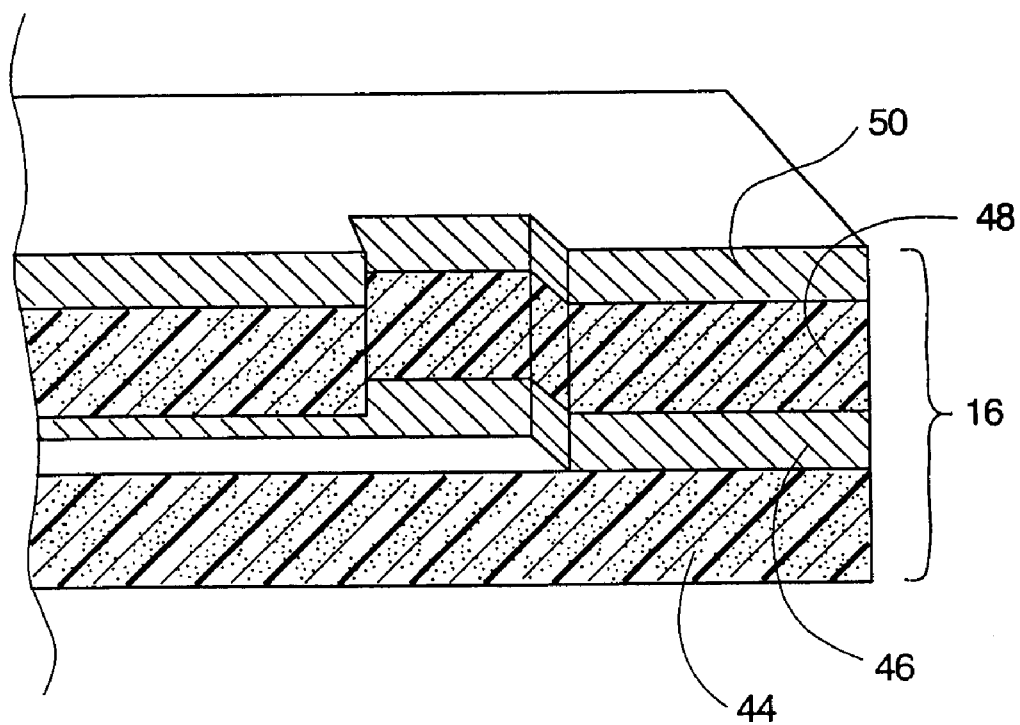
FIG. 6 is a perspective, cross-sectional drawing, with sections cut away, of part of the system shown in FIG. 1, the cross-section being the same as that shown in FIG. 3.

FIG. 6 is a perspective, cross-sectional drawing of a portion of the PCB 16 under the second IC chip 14 (the IC chip 14 not shown in FIG. 6). In FIG. 6, the optical waveguide path 28 and optical waveguide channel 26 removed for clarity. As previously discussed, the cut-away portions contain optically transmissive material.

An embodiment of a process for manufacturing the system 10 shown in FIG. 1 may be as follows. For the manufacture of the PCB 16, the first metal layer 46 may be deposited on the fiber layer 44. To form the optical waveguide channel 26, a channel may first be etched in the metal layer 46 down to the fiber layer 4 using any of a number of conventional methods. Optically transmissive material may then be deposited into the etched channel to form the optical waveguide channel 26. The geometric configuration of this waveguide channel 26, including the locations of the ends of the channel 26, will be dictated by the positioning of the opto-electronic components 40 and 41 on the IC chips 12 and 14. For example, the waveguide channel 26 may be straight, as shown in the FIG. 1 embodiment, or it may include bends within the constraints of ensuring propagation of the light in the channel 26 by internal reflection. After the formation of the channel 26 in the metal layer 46, then fiber layer 48, having metal layer 50 deposited thereon, may be affixed to the metal layer 46 using known adhesives, thus sandwiching the waveguide channel 26 between the two fiber layers 44 and 48.

To form the portion of the waveguide path 28 or 30 that extends through the PCB 16, an oblong slot, corresponding geometrically to the waveguide path 28 or 30 (see FIG. 5), may be bored perpendicularly through both the metal layer 50 and the fiber layer 48, down to the waveguide channel 26. This oblong slot is formed in a region of the layers 48 and 50 that is directly above one of the ends of the waveguide channel 26, as shown, for example, in FIGS. 3, 4 and 6. The slot may then be filled with optically transmissive material of the types discussed above, thus forming a portion of the optical waveguide path 28 (see FIGS. 3 and 4).

For the manufacture of IC chips 12 and 14, dies 22 and 24 may be fabricated using any of a number of manufacturing processes within the knowledge of a person skilled in the art. As discussed previously, each die 22 and 24 includes at least one opto-electronic component 40 and 41, although each die 22 and 24 may include many opto-electronic components. As also discussed previously, in the embodiment shown in FIGS. 1–6, opto-electronic components 40 and 41 may be surface-emitting or surface-detecting devices. Substrates 18 and 20 may be composed of conventional substrate material, for example, silicon.

To form the portion of the waveguide path 28 that extends through the substrates 18, an oblong slot, corresponding geometrically to the optical waveguide path 28 and therefore also to the slot previously bored in layers 48 and 50 of the PCB (see FIG. 5), may be cut perpendicularly through the substrate using conventional methods. Then, the bored slot may be filled with optically transmissive material. The dies 22 and 24 may then be flip-mounted on their respective substrates 18 and 20 so the light-emitting or -detecting surfaces 42 and 43 align with the portion of the optical waveguide path 28 in the substrate 20. The positions of the oblong slot in substrates 18 and 20 are therefore determined by the positions of the light-emitting and -detecting surfaces 42 and 43 of the opto-electronic components 40 and 41 on the dies 22 and 24.

The optical interconnect concepts described above can be easily adapted to enable various chip-to-chip data transfers, as well as data transfers between opto-electronic components on the same IC chip. For example, other embodiments of the invention may include more than two IC chips, and may include more than one optical channel 26 between each IC chip. The IC chips may be a processor chip and a memory hub, for example, between which data may need to pass at very high bandwidths. In such an application there may be a single physical optical waveguide channel 26 that serves the function of many parallel electrical interconnections. Other IC chips that may be optically interconnected include, for examples, a memory hub and an input/output cluster, and input/output cluster and a network device, a memory hub and memory devices, etc.

In other embodiments, the waveguide channel 26 may be branched so as to split a light signal into two identical signals of less intensity, so that an optical signal generated by a single device may be directed to two or more different opto-electronic detectors, perhaps on the same IC chip or perhaps on different IC chips. Similarly, a branched waveguide may allow light generated from different optical sources (again, perhaps on the same IC chip, although perhaps on different IC chips) to be forwarded to the same opto-electronic detector. Also, the IC chips may be on opposite sides of the same PCB, in which case the optical waveguide paths at the ends of the optical waveguide channel in the PCB would extend to the opposite surfaces of the PCB. Further yet, the optical waveguide channel in the PCB may be in any layer of a PCB. For example, the channel may be in a surface layer of the PCB, and a plastic material coating the PCB may serve to confine the optical signal in the optical waveguide channel in which it is propagating.

Aspects of the invention provide for one or more of the following advantages. Optical components on the same or different IC chip may be optically interconnected. The use of the PCB, which may be already present in an application, to provide the optical interconnect function saves space and cost. Also, the processing is not overly complicated. For example, in some embodiments, the optical coupling is achieved without the need for components such as mirrors and other light-directing components that may be expensive and difficult to position. The invention may be particularly useful in computer motherboard applications where bandwidth requirements dictate the need for optical signaling between different IC chips, although many other applications are contemplated as well.

A number of embodiments of the invention have been described. Nevertheless, it will be understood that various modifications may be made without departing from the spirit and scope of the invention. Accordingly, other embodiments are within the scope of the following claims.

What is claimed is:

1. An opto-electronic system comprising:
    printed circuit board comprising an intermediate layer having an optical waveguide channel with first and second ends extending planarly therein, the printed circuit board further comprising first and second optical waveguide paths extending respectively from the first and second ends of the optical waveguide channel to a surface of the printed circuit board, wherein the first and second waveguide paths have oblong cross-sections; and
    first and second integrated circuit chips mounted on the printed circuit board, each chip comprising an opto-electronic component, the first and second chips being mounted so that the opto-electronic components on the first and second chips are respectively optically coupled to the first and second optical waveguide paths in the printed circuit board and thus optically interconnected with each other.

2. The opto-electronic system of claim 1 wherein the oblong cross-sections each have a largest cross-sectional measure, and further wherein the first and second ends of the optical waveguide channel each has an axial orientation with respect to the oblong cross-sections of the respective optical waveguide paths parallel to the largest cross-sectional measures.

3. The opto-electronic system of claim 2 wherein the opto-electronic components each have a light transducing surface whose orientation with respect to center axes of the respective first and second waveguide paths are offset from center at a side having the greatest diameter and opposite a side where light is coupled to the optical waveguide channel.

4. The opto-electronic system of claim 1 wherein the opto-electronic components each have a light transducing surface whose orientation with respect to center axes of the respective first and second waveguide paths are offset from center at a side opposite a side where light is coupled to the optical waveguide channel.

5. The opto-electronic system of claim 2 wherein the first and second chips each comprise a die flip-mounted on a substrate, the opto-electronic components being contained within the respective dies and having light-transducing surfaces directed toward the respective substrates.

6. The opto-electronic system of claim 5 wherein the substrates of the first and second chips each further comprise an optical waveguide path extending perpendicularly therethrough between the light-transducing surfaces of the respective opto-electronic components and the respective optical waveguide paths in the printed circuit board.

7. An opto-electronic system comprising:
    printed circuit board comprising an intermediate layer having an optical waveguide channel with first and second ends extending planarly therein, the printed circuit board further comprising first and second optical waveguide paths extending respectively from the first and second ends of the optical waveguide channel to a surface of the printed circuit; and
    first and second integrated circuit chips mounted on the printed circuit board, each chip comprising an opto-electronic component, the first and second chips being mounted so that the opto-electronic components on the first and second chips are respectively optically coupled to the first and second optical waveguide paths in the printed circuit board and thus optically interconnected with each other, wherein the first and second chips each comprise a die flip-mounted on a substrate, the opto-electronic components being contained within the respective dies and having light-transducing surfaces directed toward the respective substrates, wherein further the substrates of the first and second chips each further comprise an optical waveguide path extending perpendicularly therethrough between the light-transducing surfaces of the respective opto-electronic components and the respective optical waveguide paths in the printed circuit board, and wherein the light-transducing surfaces of the opto-electronic components are each offset from a center axis of each of the respective first and second waveguide paths at a side opposite a side where light is coupled to the optical waveguide channel.

8. An opto-electronic system comprising:
    printed circuit board comprising an intermediate layer having an optical waveguide channel with first and second ends extending planarly therein, the printed circuit board further comprising first and second optical waveguide paths extending respectively from the first and second ends of the optical wave guide channel to a surface of the printed circuit, wherein the intermediate layer comprises a metal and an optical waveguide material, the optical waveguide material being the optical waveguide channel and bounded on each side by the metal; and first and second integrated circuit chips mounted on the printed circuit board, each chip comprising an opto-electronic component, the first and second chips being mounted so that the opto-electronic components on the first and second chips are respectively optically coupled to the first and second optical waveguide paths in the printed circuit board and thus optically interconnected with each other.

9. The opto-electronic system of claim 8 wherein the printed circuit board further comprises two fiber layers bounding the intermediate layer therebetween.

10. An opto-electronic system comprising:

printed circuit board comprising an intermediate layer having an optical waveguide channel with first and second ends extending planarly therein, the printed circuit board further comprising first and second optical waveguide paths extending respectively from the first and second ends of the optical wave guide channel to a surface of the printed circuit board wherein the first and second waveguide paths have oblong cross-sections; and an integrated circuit chip mounted on the printed circuit board and comprising a first and a second opto-electronic component, the chip being mounted so that the opto-electronic components on the chip are optically coupled to the first and second optical waveguide paths in the printed circuit board and thus optically interconnected with each other.

11. The opto-electronic system of claim 10 wherein the oblong cross-sections each have a largest cross-sectional measure, and further wherein the first and second ends of the optical waveguide channel each has an axial orientation with respect to the oblong cross-sections of the respective optical waveguide paths parallel to the largest cross-sectional measures.

12. The opto-electronic system of claim 11 wherein the opto-electronic components each have a light transducing surface whose orientation with respect to center axes of the respective first and second waveguide paths are offset from center at a side having the greatest diameter and opposite a side where light is coupled to the optical waveguide channel.

13. The opto-electronic system of claim 10 wherein the chip comprises a die flip-mounted on a substrate, the opto-electronic components being contained within the die and having light-transducing surfaces directed toward the substrate.

14. The opto-electronic system of claim 13 wherein the substrate comprises a first and a second optical waveguide path extending perpendicularly therethrough between the light-transducing surfaces of the respective opto-electronic components and the respective optical waveguide paths in the printed circuit board.

15. An opto-electronic system comprising:

a printed circuit board comprising an intermediate layer having an optical waveguide channel with first and second ends extending planarly therein, the printed circuit board further comprising first and second optical waveguide paths extending respectively from the first and second ends of the optical wave guide channel to a surface of the printed circuit board, and wherein the intermediate layer comprises a metal and an optical waveguide material, the optical waveguide material being the optical waveguide channel and bounded on each side by the metal; and an integrated circuit chip mounted on the printed circuit board and comprising a first and a second opto-electronic component, the chip being mounted so that the opto-electronic components on the chip are optically coupled to the first and second optical waveguide paths in the printed circuit board and thus optically interconnected with each other.

16. The opto-electronic system of claim 15 wherein the printed circuit board further comprises two fiber layers bounding the intermediate layer therebetween.

17. A method of forming an optical interconnect in a printed circuit board, comprising:

etching a channel in a metal layer deposited on a first fiber layer;

filling the etched channel with an optical transmissive material;

affixing a second fiber layer to the metal layer, thus forming an optical waveguide channel between the first and the second fiber layers, the optical waveguide channel having a first end and a second end; and at each of the two ends of the optical waveguide channel, forming an optical waveguide path perpendicularly through one of the first or the second fiber layers to a surface of the printed circuit board.

18. The method of claim 17 wherein the first and second perpendicular waveguide paths have oblong cross-sections.

19. The method of claim 18 wherein the oblong cross-sections each have a largest cross-sectional measure, and further wherein the first and second ends of the optical waveguide channel each has an axial orientation with respect to the oblong cross-sections of the respective optical waveguide paths parallel to the largest cross-sectional measures.

20. The method of claim 17 wherein the optical waveguide paths coupled to the first and second ends of the optical waveguide channel extend from the optical waveguide channel to the same surface of the printed circuit board.

21. A method of producing an optical communication system in a printed circuit board, comprising:

etching a channel in a metal layer deposited on a first fiber layer;

filling the etched channel with an optical transmissive material;

affixing a second fiber layer to the metal layer, thus forming an optical waveguide channel between the first and the second fiber layers, the optical waveguide channel having a first end and a second end;

at each of the two ends of the optical waveguide channel, forming an optical waveguide path perpendicularly through one of the first or the second fiber layers to a surface of the printed circuit board; and coupling the light transducing surface of an integrated circuit chip to each waveguide path, wherein the light transducing surfaces are offset from the center axis of the waveguide paths to which they are coupled.

22. The method of claim 21 wherein the first and second waveguide paths have oblong cross-sections.

23. The method of claim 22 wherein the oblong cross-sections each have a largest cross-sectional measure, and further wherein the first and second ends of the optical waveguide channel each has an axial orientation with respect to the oblong cross-sections of the respective optical waveguide paths parallel to the largest cross-sectional measures.

24. The method of claim 21 wherein the optical waveguide paths coupled to the first and second ends of the optical waveguide channel extend from the optical waveguide channel to the same surface of the printed circuit board.

* * * * *